United States Patent

[11] 3,567,958

[72] Inventor Robert H. Bickley
Milford, Conn.

[21] Appl. No. 744,533
[22] Filed July 12, 1968
[45] Patented Mar. 2, 1971
[73] Assignee The Singer Company
New York, N.Y.

[54] HIGH-SPEED TRANSISTOR BINARY FREQUENCY DIVIDER
4 Claims, 2 Drawing Figs.

[52] U.S. Cl. .......... 307/220, 307/225, 307/292, 328/30, 307/295
[51] Int. Cl. .......... H03k 21/00
[50] Field of Search .......... 307/220, 225, 291, 292, 295; 328/16, 25, 30, 39; 331/51, 52, 113

[56] References Cited

UNITED STATES PATENTS

| | | | |
|---|---|---|---|
| 2,605,306 | 7/1952 | Eberhard | 331/113X |
| 2,787,712 | 4/1957 | Priebe, Jr. et al. | 307/292X |
| 3,075,095 | 1/1963 | Stevens | 331/113 |
| 3,193,702 | 7/1965 | Claessen | 328/206X |
| 3,293,569 | 12/1966 | Englund, Jr. et al. | 331/113 |
| 3,294,980 | 12/1966 | Whittle | 307/292X |
| 3,399,311 | 8/1968 | Andrea | 307/225 |
| 3,469,109 | 9/1969 | Schrecongost | 307/220 |

*Primary Examiner*—Stanley D. Miller, Jr.
*Attorneys*—Marshall J. Breen and Chester A. Williams, Jr.

ABSTRACT: A circuit is disclosed in which a pair of collector-base cross-coupled transistors operating as intermittent amplifiers are adapted to operate conductively in their active regions only during alternate negative half cycles of an AC input signal and results in an output signal from either transistor having one-half the frequency of the input signal. The transistors operate in their active regions only during every fourth half cycle of the input wave form and during the rest of the time they are purposely cut off by reverse bias. A "-memory" capacitor connected from each emitter to ground maintains the emitter voltage so that the transistor is cut off during its next normal opportunity to conduct thus amplification is prevented during alternate half cycles of input voltage. This capacitor also provides low AC emitter-to-ground impedance thus allowing transistor amplification of the input half wave when the transistor is not cut off. This circuit permits high-speed operation because the transistors are never operated in their saturated region and the time delay required to turn off a saturated transistor is thus avoided. As a result, this circuit can be made to divide with nearly constant sensitivity over the entire input frequency range of from 60 megahertz to frequencies above one gigahertz.

Figure 1:
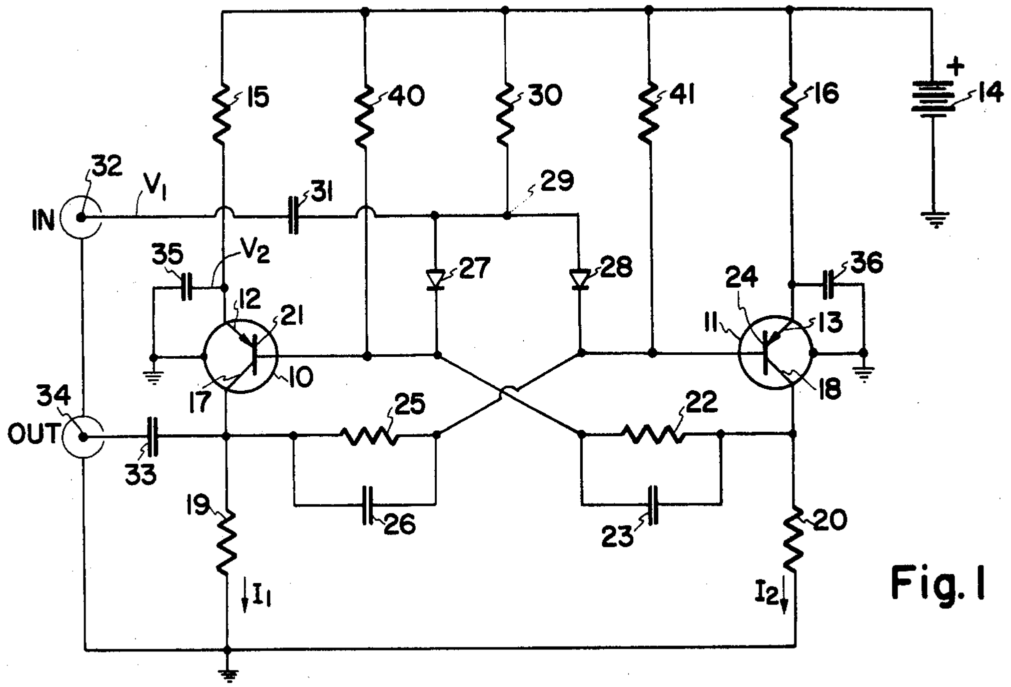

INVENTOR.
Robert H. Bickley
BY
Marshall J. Breen
ATTORNEY

WITNESS:
Heidi Schlechauf

HIGH-SPEED TRANSISTOR BINARY FREQUENCY DIVIDER

BACKGROUND OF THE INVENTION

Transistor multivibrator circuits of the simple saturating type are known in the prior art but these have definite speed limitations and are usable for input frequencies of only up to about 1 megahertz. Some improvement has been obtained by employing nonsaturating type transistor circuits up to about 100 megahertz but these circuits are, in general, rather complex and require the use of clamping diodes, additional supply voltages, cross coupling transistors and/or expensive step recovery diodes to attain the higher frequency limits.

So far as I am aware, prior to this invention, no simple circuit existed employing but two transistors, two trigger diodes and a single power supply voltage in a dynamically bistable arrangement which could be operated effectively at input AC frequencies in a range above 60 megahertz and it is a specific object of this invention to provide such a circuit.

SUMMARY OF THE INVENTION

THe above stated objective is accomplished in accordance with the invention herein described by a dynamically bistable toggling multivibrator comprising a pair of symmetrically related collector-base cross-coupled PNP transistor amplifiers statically biased slightly into their active region. A negative-going voltage applied to diodes connected symmetrically to the bases of the two transistors will drive one of the transistors well into its active region and will, by regeneration through the collector-base cross coupling, drive the other transistor to cutoff. Between each emitter and ground is a storage or "memory" capacitor, which upon conduction of its associated transistor discharges to a less positive potential which cannot change instantly, so that, upon cutoff of this transistor, a larger base drive signal will for a time be required to turn it on again. The combination of the positive-going voltage from the collector of the other transistor applied to the base and the memory capacitor's charge to a less positive potential at the emitter, holds this transistor off on the next negative half wave of input voltage while the other transistor (which has been held off in the same way) is turned on by the input waveform.

IN THE DRAWINGS

Figure 2:
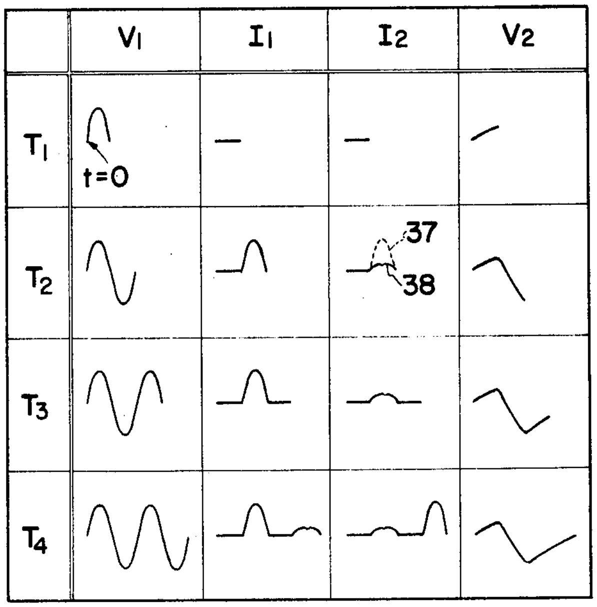

FIG. 1 is a circuit diagram illustrating a preferred embodiment of this invention; and FIG. 2 illustrates the wave forms of voltage and current occuring at various points in the circuit as related in time to the input waveform.

DESCRIPTION OF THE INVENTION

Referring now to FIG. 1 two PNP type transistors 10 and 11 are shown in a circuit configuration representing a preferred embodiment of the invention. Emitters 12 and 13 are supplied with positive bias voltage from a battery 14 by way of respective emitter load resistors 15 and 16. Collectors 17 and 18 are connected to a reference potential designated as ground by way of respective collector load resistors 19 and 20. Base 21 of transistor 10 is connected by way of shunt RC circuit 22, 23 to the collector 18 of TRANSISTOR 11. Base 24 of transistor 11 is connected by way of shunt RC circuit 25, 26 to the collector 17 of transistor 10. Diodes 27 and 28 have their anodes connected to a common junction 29 and thence by way of resistor 30 to the positive terminal of battery 14. The common junction 29 also is connected through a capacitor 31 to an input terminal 32. Diode 27 has its cathode connected to the base 21 of transistor 10 and diode 28 has its cathode connected to the base 24 of transistor 11. The collector 17 of transistor 10 is connected through capacitor 33 to output terminal 34. The bases 21 and 24 are also connected to the positive terminal of battery 14 through respective base resistors 40 and 41.

The emitter 12 of transistor 10 is connected through storage capacitor 35 to reference ground and the emitter 13 of transistor 11 is connected through storage capacitor 36 to reference ground.

The operation of this I$_{w}$ill be discussed by describing what happens during four increasing time intervals $T_1$ —$T_4$, corresponding to successive half-wave periods of the input AC signal supplied to terminal 32. FIG. 2 is a convenient tabulation of this operation wherein the horizontal rows indicate the successively increasing time intervals and the vertical columns represent the wave forms corresponding to the heading indication where $V_1$ is the input voltage, $I_1$ is the current in collector 17, Id 2 is the current in collector 18 and $V_2$ is the voltage at emitter 12.

At time =*0* (which marks the beginning of the interval $T_1$), it is assumed that transistor 11 has just turned off and that the input voltage $V_1$ swings positive. The diodes 27 and 28 conduct and the positive excursion of the input voltage on the bases of both transistors keep their emitter-base junctions reverse biased. Thus there is no collector current in either transistor and both $I_1$ and $I_2$ are zero. The voltage $V_2$ on emitter 12 is controlled by the charging of the capacitor 35 through the resistance 15 when the transistor 10 turns off and by the discharging of this capacitor through resistance 19 due to emitter current when the transistor 10 turns on. Thus, during the interval $T_1$, $V_2$ will continue to increase towards the positive voltage of battery 14 as shown. During the next interval $T_2$, the input voltage $V_1$ swings negative. The capacitor 35 has charged more than capacitor 36 toward battery positive voltage because transistor 10 has been off longer than transistor 11, and therefore the emitter-base junction of transistor 10 becomes forward biased before that of transistor 11. Transistor 10 turns on and the positive-going voltage at its collector 17 caused by $I_1$ is cross coupled through 25, 26 and fed back to the base 24 of transistor 11. This positive-going voltage substantially cancels the negative-going input voltage at the base 24 so that transistor 11 cannot turn on in this interval. The negative-going input signal at the anode of diode 28 combined with the positive-going fed back voltage at its cathode reverse biases diode 28 so that the positive-going fed back voltage can predominate at base 24 and assure that transistor 11 cuts off. During the interval $T_2$, the dotted wave form 37 shown for $I_2$ indicates what would happen if there were no feed back of the positive-going voltage from the collector 17 to cancel the negative-going input voltage $V_1$ at the base 24 of transistor 11. Normally this cancellation is fully effective and no collector current $I_2$ flows during this period. However, for very large input voltages $V_1$, the cancellation may not be complete and some collector current $I_2$ may get through as indicated by the small pulse 38 shown. This small current pulse is shown here in exaggerated form to more fully explain the circuit operation and will have no substantial effect on performance since the fundamental frequency of the output waveform is still half that of the input even if pulse 38 is present.

During the next interval $T_3$, the input voltage $V_1$ swings positive and both transistors are reverse biased due to the positive input voltage applied through diodes 27 and 28 so no collector current flows in either transistor.

During the next interval $T_4$, the input voltage $V_1$ swings negative. Transistor 11 has not been conducting for the last three input half-cycle intervals so that capacitor 36 has had time to charge more than capacitor 35 toward battery positive voltage and as the input voltage swings negative, the emitter-base junction of transistor 11 becomes forward biased and turns on before transistor 10 has a chance to turn on. The collector current $I_2$ of transistor 11 produces in resistance 20 a positive-going voltage which is coupled through 22, 23 and fed back to the base 21 where it cancels the negative-going input voltage so that transistor 10 cannot turn on during this interval. The next interval is a repetition of $T_1$ and the cycle described above is repeated as long as the input voltage is applied. It will be seen that for every two cycles of input voltage $V_1$, one cycle of output voltage is obtained and that the same output voltage waveform can be obtained from either collector 17 or 18, the relative difference being only a matter of phase shift.

The controlled charging and discharging of the emitter capacitors 35 and 36 as described above, in effect, provides a "memory" feature which enables the circuit to "remember" which transistor was last conductive and to prepare the opposite transistor for conduction at the opportunity to conduct. This feature enables the transistors to turn on alternatively and with very fast response so that the circuit provides frequency division (by 2) of input frequencies extending in a range significantly above 60 megahertz.

It will be understood that the circuit described above is not of the ordinary type which has two quiescently stable states in which one transistor is saturated and the other is cutoff. The circuit of this invention has a single quiescently stable state in which both transistors conduct nearly the same current. It is the application of the input wave form which causes the toggling action in this circuit wherein one transistor is driven more into conduction and the other transistor is driven to cutoff on an alternative basis.

The "memory" capacitors are selected with relation to the emitter resistors so that the resulting RC time constant is too slow relative to the input frequency to permit the emitter voltage to follow the positive-going base potential at input frequency and thus the emitter-base junction becomes reverse biased and the transister is turned off. This "memory" function of the emitter capacitor, coupled with the inhibit function of the positive-going collector voltage feed back to the opposite base, provides the selective alternative conduction of the transistors and keeps them substantially cutoff the rest of the time.

I claim:

1. A frequency divider circuit comprising two transistors each having first and second electrodes and a control electrode, a network connecting the first electrode of each transistor to the control electrode of the other transistor, individual means for storing electrical energy connected respectively between each of said second electrodes and a common point of reference potential, a single input terminal for supplying an AC signal to said circuit, means connecting the input terminal to the common junction of similar electrodes of two diodes DC biased for forward conduction, means connecting the electrodes of each diode opposite to the common junction electrode respectively to the control electrode of each transistor, and an output terminal AC coupled to the first electrode of one of said transistors.

2. A frequency divider circuit comprising a pair of transistors adapted to be alternatively conductive only on negative half cycles of an input AC signal, each transistor having a base, an emitter and a collector, a network connecting the base of each transistor with the collector of the other transistor; individual means for storing electrical energy connected respectively between each emitter and a common point of reference potential, an AC input terminal, means connecting said input terminal to the common junction of similar electrodes of the two diodes DC biased for forward conduction, means connecting the opposite electrodes of each diode respectively to the base of each transistor, and a single output terminal AC coupled to the collector on one of the transistors.

3. A frequency divider circuit comprising a pair of similar transistors connected in a symmetrical collector-base cross-coupled arrangement, two similar diodes respectively applying a single AC input signal simultaneously to each base, said diodes being DC biased for forward conduction toward the bases, individual means for storing electrical energy connected respectively between each emitter and a common point of reference potential, and an output terminal connected to the collector of one of said transistors.

4. A frequency divider circuit comprising a pair of similar transistors connected in a symmetrical collector-base cross-coupled configuration, two similar diodes respectively connected to apply a single AC input signal simultaneously to each base, each of said diodes being DC biased for forward conduction toward the respective base, means including a separate capacitor connected between each emitter and a common point of reference voltage, and a separate resistor connected between each emitter and a DC bias source whereby the emitter of one transistor is selectively held alternately at a more positive voltage with respect to its base than the other transistor during successive negative excursions of the input AC signal.

PO-1050
(5/69)

UNITED STATES PATENT OFFICE
CERTIFICATE OF CORRECTION

Patent No. 3,567,958 Dated March 2, 1971

Inventor(s) Robert H. Bickley

It is certified that error appears in the above-identified patent and that said Letters Patent are hereby corrected as shown below:

Col. 2, line 5, delete "I" and add, --circuit-- ,
line 15, after "time", add --T-- , Col. 3, line 9, after "the", add --next-- .

Signed and sealed this 22nd day of June 1971.

(SEAL)
Attest:

EDWARD M.FLETCHER,JR.
Attesting Officer

WILLIAM E. SCHUYLER, JR
Commissioner of Patents